(12) United States Patent
Hagerup

(10) Patent No.: US 6,477,054 B1
(45) Date of Patent: Nov. 5, 2002

(54) LOW TEMPERATURE CO-FIRED CERAMIC SUBSTRATE STRUCTURE HAVING A CAPACITOR AND THERMALLY CONDUCTIVE VIA

(75) Inventor: William A. Hagerup, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/636,128

(22) Filed: Aug. 10, 2000

(51) Int. Cl.[7] ................................................. H05K 7/20
(52) U.S. Cl. ........................ 361/720; 174/262; 361/712; 361/783; 257/713
(58) Field of Search ................................ 174/252, 262; 361/760, 782, 783, 793, 792, 795, 794, 719, 720, 713, 704, 712, 714, 715, 717, 709; 257/712, 717

(56) References Cited

U.S. PATENT DOCUMENTS

| | | | |
|---|---|---|---|
| 5,218,322 A | | 6/1993 | Allison et al. |
| 5,386,339 A | | 1/1995 | Polinski et al. |
| 5,604,673 A | | 2/1997 | Washburn et al. |
| 5,708,566 A | * | 1/1998 | Hunninghaus et al. ...... 361/764 |
| 5,870,289 A | * | 2/1999 | Tokuda et al. ............... 361/779 |
| 6,156,980 A | * | 12/2000 | Peugh et al. ................. 174/252 |
| 6,190,941 B1 | * | 2/2001 | Heinz et al. ................. 438/106 |
| 6,212,076 B1 | * | 4/2001 | MacQuarrie et al. ........ 361/720 |
| 6,226,183 B1 | * | 5/2001 | Weber et al. ................ 361/704 |
| 6,282,094 B1 | * | 8/2001 | Lo et al. ...................... 361/704 |

* cited by examiner

Primary Examiner—Kamand Cuneo
Assistant Examiner—Jose H. Alcala
(74) Attorney, Agent, or Firm—William K. Bucher

(57) ABSTRACT

A low temperature co-fired ceramic substrate structure has first and second conductive patterns respectively disposed on first and second dielectric layers with the conductive patterns being separated by the first dielectric layer. The first conductive pattern has a first conductive element functioning as a first plate of a capacitor and a second conductive element functioning as a voltage potential lead for an integrated circuit device. The second conductive pattern is positioned below the first conductive pattern and functions as the second plate of the capacitor and as a thermally conductive heat transfer layer for the integrated circuit device. At least a first thermally conductive via is formed between the top and bottom surfaces of the second dielectric layer and below the second conductive element with the via thermally coupled to the second conductive pattern. The thermal via or vias may be thermally coupled to a heat sink disposed adjacent to the bottom surface of the second dielectric layer.

19 Claims, 2 Drawing Sheets

LOW TEMPERATURE CO-FIRED CERAMIC SUBSTRATE STRUCTURE HAVING A CAPACITOR AND THERMALLY CONDUCTIVE VIA

BACKGROUND OF THE INVENTION

The present invention relates generally to substrate structures and more particularly to a low temperature co-fired ceramic substrate structure having a dual use buried layer.

Various type of dielectric materials are used for forming substrates for electronic applications. One common material used for substrates is an alumina ceramic material with conventional thick or thin film resistors and metallization formed on the top surface of the substrate. Alumina ceramic substrates have the advantage of being thermally conductive, which aids in the dissipation of heat generated by integrated circuit devices mounted on the substrate. A drawback to alumina ceramic substrates is the inability to form interior layers in the substrate.

Low temperature co-fired ceramic (LTCC) material is also used for forming dielectric substrates for electronic applications. The advantage of LTCC material is the ability for form buried components, such as resistors, capacitors, inductors, transformers and the like within the substrate. U.S. Pat. No. 5,604,673 teaches a low temperature co-fired ceramic substrate for power converters. The low temperature co-fired ceramic substrate includes a number of layers with various metallized conductors located on the outer surface and various inner layers of the substrate. A cavity into which an integrated circuit is placed may be formed with or without thermal vias being formed in the substrate immediately beneath the cavity. A heat sink is positioned underneath the substrate that mates with the thermal vias to provide thermal management for the electronic circuit formed on the substrate. Alternatively, the integrated circuit device may be positioned on the top surface of the substrate with thermal vias formed beneath the substrate location. A cavity is formed in the substrate from the opposite side of the substrate that receives a heat sink. The heat sink mates with the thermal vias underneath the integrated circuit device for thermal management. A further alternative is to form an in-situ heat sink in the low temperature co-fired ceramic substrate using high thermal conductivity LTCC tape as described in U.S. Pat. No. 5,386,339. A portion of the low temperature co-fired ceramic substrate under the integrated circuit is replaced with the high thermal conductivity LTCC tape.

Various strip line components and passive devices are formed in the low temperature co-fired ceramic substrate as required by the particular circuit design. For example, a capacitor may be formed by locating two parallel conductive plate structures adjacent to each other and separated by a low temperature co-fired ceramic layer in between. Conductive vias may be used to connect the plates to components on the surface of the substrate on other buried components in the substrate.

A drawback to the above described co-fired ceramic structures is providing the proper voltages to the integrated circuit device while providing thermal management of heat generated by the device. Generally, surface mounted IC devices have their bottom surface acting as a voltage input lead. The prior art teaches coupling this lead to a ground potential through the heat sink and vias. However, in certain applications the voltage input lead on the bottom of the IC needs to be at some voltage level, such as a negative source voltage. Therefore, there is a need for a LTCC substrate structure that allow the bottom surface voltage input leads of an IC to be coupled to a non-electrical ground voltage supply while maintaining the heat sink at ground potential to provide thermal management of the heat generated by the IC device. Such a structure should have a minimal effect on the overall size of the substrate. The substrate structure should also provide flexibility in laying out and connecting various components formed on and in the substrate structure. Further, there is a need to combine elements of the thermal management structure with the component structures for maintaining a minimum size for the substrate.

SUMMARY OF THE INVENTION

Accordingly, the present invention is to a low temperature co-fired ceramic substrate structure having first and second dielectric layers with top and bottom surfaces. The top surface of the first dielectric layer has a first conductive pattern formed thereon having a first conductive element functioning as a first plate of a capacitor. A second conductive element formed on the top surface functions as a voltage potential lead for an integrated circuit device where the bottom surface of the integrated circuit device is a voltage input lead for the integrated circuit device. A second conductive pattern is disposed between the first and second dielectric layers and positioned below the first conductive pattern to function as a second plate of the capacitor and as a thermally conductive heat transfer layer for the integrated circuit device. At least a first thermally conductive via is formed between the top and bottom surfaces of the second dielectric layer and below the second conductive element on the top surface of the first dielectric layer. The via is thermally coupled to the second conductive pattern.

Preferably, the substrate structure has a plurality of thermally conductive vias formed beneath the integrated circuit device in an array pattern. A heat sink may be disposed adjacent to the bottom surface of the second dielectric layer and thermally coupled to the thermally conductive via or vias. In the preferred embodiment of the invention, a third conductive pattern is formed on the bottom surface of the second dielectric layer that is thermally coupled to the thermally conductive via or vias. The heat sink is disposed adjacent to the bottom surface of the second dielectric layer and thermally coupled to the third conductive pattern. The thermally conductive via or vias are preferably cylindrically formed bores filled with a high thermally conductive material, such as gold. It is also preferred that the thermally conductive via or vias be electrically conductive.

The first dielectric layer preferably has a thickness approximately 0.004 inches and the second dielectric layer has a thickness approximately 0.025 inches. The conductive patterns have a thickness approximately 0.0005 inches. Each of thermally conductive vias in the array have a bore diameter approximately 0.010 inches and a center to center spacing approximately 0.020 inches.

The objects, advantages and novel features of the present invention are apparent from the following detailed description when read in conjunction with appended claims and attached drawings.

DETAILED DESCRIPTION OF THE PREFERRED EMBODIMENT

Figure 1:
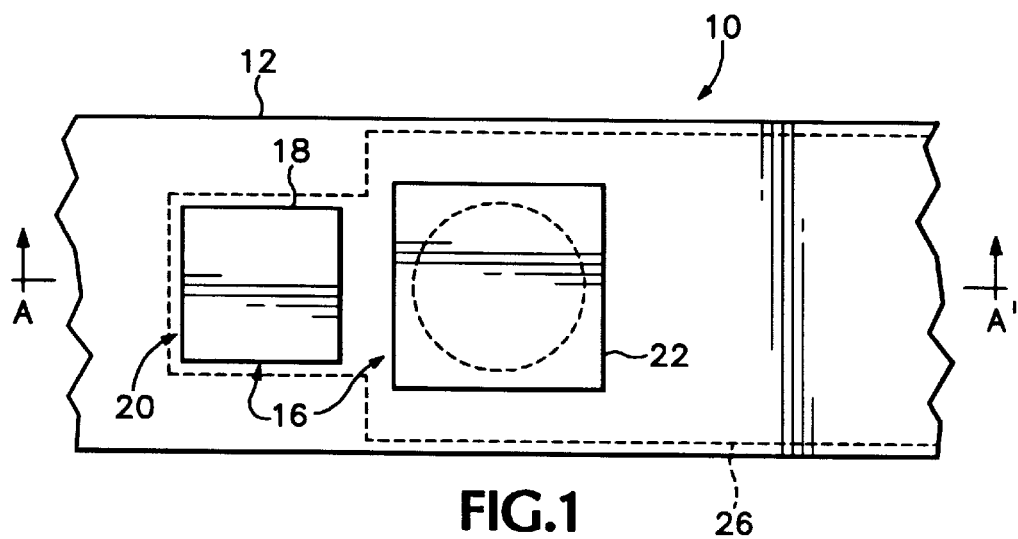
FIG. 1 is a top plan view of a first embodiment of the low temperature co-fired ceramic substrate structure according to the present invention.
Figure 2:
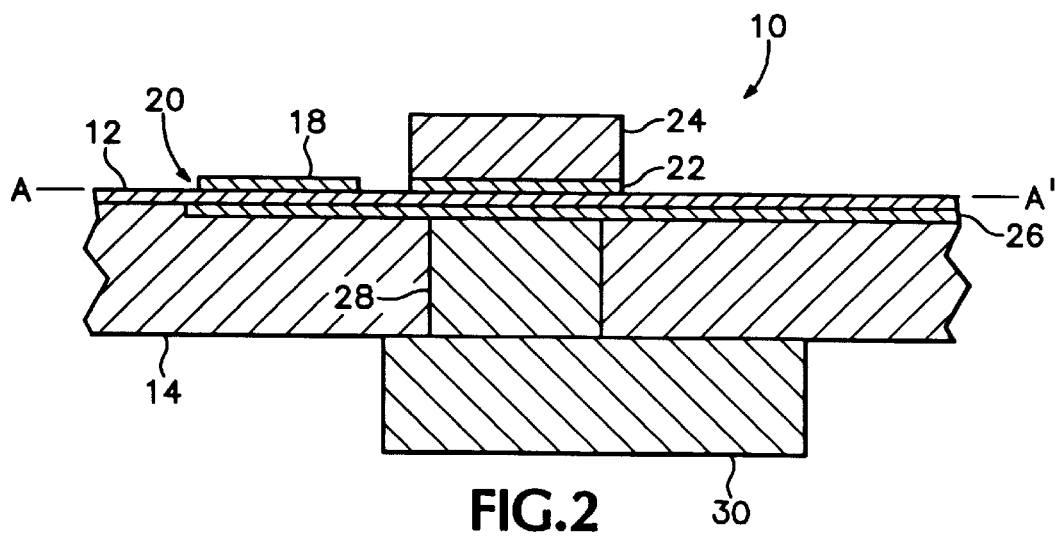
FIG. 2 is a side sectional view along line A–A' of the first embodiment of the low temperature co-fired ceramic substrate structure according to the present invention.

Referring to FIG. 1, there is shown a top plan view of a first embodiment of the low temperature co-fired ceramic (LTCC) substrate structure 10 of the present invention. The substrate structure 10 is a multilayer structure formed of individual layers of dielectric LTCC material as best viewed in the side sectional view along line A–A' in FIG. 2. The substrate structure 10 is preferably implemented using Dupont 951 LTCC material but other LTCC material having similar characteristics to the Dupont 951 material may equally be used in the present invention.

The substrate structure 10 has first and second dielectric layers 12 and 14 having top and bottom surfaces. The top surface of the first dielectric layer has a first conductive pattern 16 formed thereon. The conductive pattern 16 has a first conductive element 18 functioning as a first plate of a capacitor 20. A second conductive element 22 is formed on the top surface of the first dielectric layer and functions as a voltage potential lead for an integrated circuit device 24. In the preferred embodiment, the integrated circuit device 24, such as a surface mounted operational amplifier, uses the bottom surface of the device as a voltage potential lead for the device and generally has a negative voltage potential applied to it. Disposed between the first and second dielectric layers and positioned below the first conductive pattern 16 is a second conductive pattern 26. The second conductive pattern 26 functions as the second plate of the capacitor 20 and as a thermally conductive heat transfer layer for the integrated circuit device 24. A thermally conductive via 28 is formed between the top and bottom surfaces of the second dielectric layer 14 and below the second conductive element 22 on the top surface of the dielectric layer 12. A heat sink 30 is preferably positioned adjacent to the bottom surface of the second dielectric layer 14 and thermally coupled to the second conductive pattern 26 through the via 28.

The second conductive pattern 26 acts a both a circuit element and a heat transfer layer in the substrate structure 10. The thickness of the first dielectric layer 12 is a function of the thermal properties of the dielectric layer material. The thickness of the first dielectric layer 12 using Dupont 951 LTCC material is approximately 0.004 inches. The thickness of the second dielectric layer using the same LTCC material approximately 0.025 inches. The first and second conductive patterns 16 and 26 may be formed using well known thick or thin film processes. In the preferred embodiment, the first and second conductive patterns 16 and 26 have a thickness approximately 0.0005 inches. The cylindrical bore formed in the second dielectric layer 14 is preferably filled with a thermally conductive material, such as gold, to produce the thermally conductive via 28. Other materials known in the art may also be used to produce the thermally conductive via in the LTCC material. In the preferred embodiment, the thermally conductive via is also electrically conductive. This allows flexibility in circuit design using the substrate structure of the present invention where the second conductive pattern 26, the via 28 and the heat sink 30 may be coupled to electrical ground.

Figure 3:
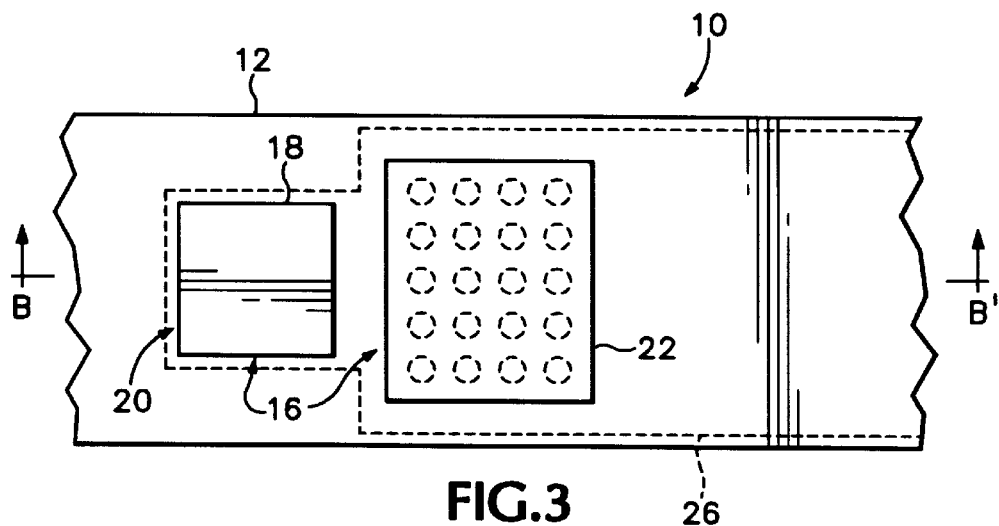
FIG. 3 is a top plan view of the preferred embodiment of the low temperature co-fired ceramic substrate structure according to the present invention.
Figure 4:
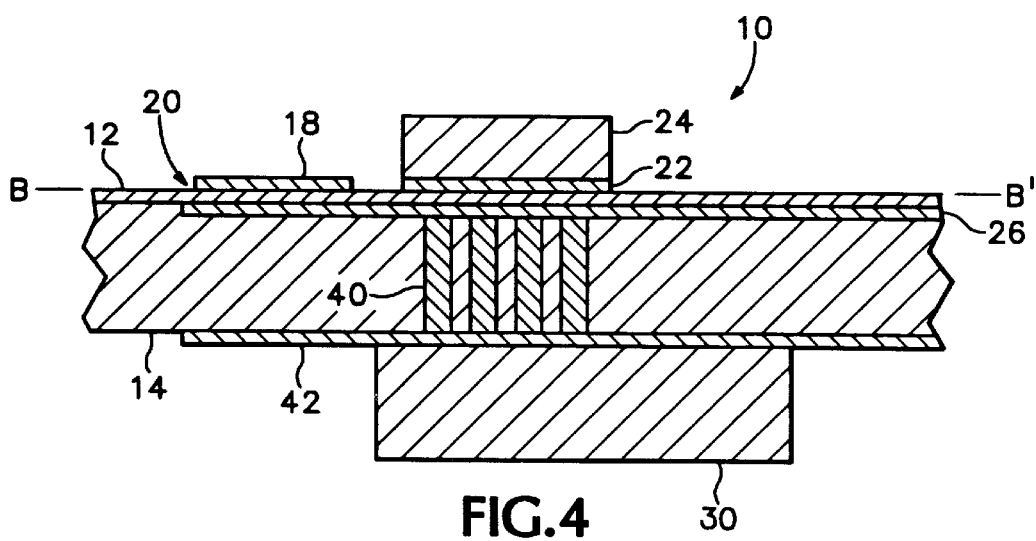
FIG. 4 is a side sectional view along line B–B' of the preferred embodiment of the low temperature co-fired ceramic substrate structure according to the present invention.

Referring to FIGS. 3 and 4, there are shown a top plan view and the side sectional view along line B–B' of the preferred embodiment of the LTCC substrate structure 10 of the present invention. Like elements in FIGS. 3 and 4 are labeled the same as in FIGS. 1 and 2. The relative positions of the first and second conductive patterns 16 and 26 to each other and their placement in relation to the first and second dielectric layers 12 and 14 are the same as in the previously described figures. Further, the thickness of the respective dielectric layers 12 and 14 and the conductive patterns 16 and 26 are the same as in the previous described figures. The preferred embodiment uses a plurality of thermally conductive vias 40 beneath the second conductive element 22 instead of a single conductive via. The plurality of thermally conductive vias are cylindrically bores formed between the top and bottom surfaces of the second dielectric substrate 14. The bores have a diameter approximately 0.010 inches and a center to center spacing between the bores approximately 0.020 inches. The bores are filled with a thermally conductive material that is electrically conductive, such as gold. The vias are thermally and electrically coupled to the second conductive pattern 26 and to a third conductive pattern 42 on the bottom surface of the second dielectric layer. The heat sink 30 is positioned adjacent to the third conductive pattern and is thermally and electrically coupled to it.

The substrate structure 10 of the present invention is advantageously used in hybrids for high speed probe circuits where substrate size is of great importance. The capacitor 20 formed by the first conductive element 18 and the second conductive pattern 26 may be part of a input parallel resistor-capacitor network for a differential attenuator. For high speed applications a surface mounted buffer amplifier integrated circuit is positioned directly adjacent to the differential attenuator. The bottom surface of the buffer amplifier is configured as a voltage input lead and is coupled to a negative voltage source through the second conductive element 22. The heat sink 30 is coupled to electrical ground. The first dielectric layer 12 insulates the second conductive element at the negative voltage potential from the heat transfer layer that is coupled to electrical ground through the thermally conductive vias to the heat sink. The first dielectric layer also provides electrical separation between the first conductive element forming one plate of capacitor 20 and the second conductive pattern 26 forming the second plate of the capacitor 20. Alternately, the second conductive pattern 26 may be coupled to electrical ground resulting in the heat sink being coupled to electrical ground through the plurality of vias 40.

The substrate structure 10 of the present invention has been shown using two LTCC dielectric layers with the top surface of the first dielectric layer 12 being the top surface of the substrate. The substrate structure 10 of the present invention may equally be used in a LTCC substrate where the first and second dielectric layers 12 and 14 are disposed within a larger stack of LTCC dielectric layers. In such a configuration, the substrate has a cavity formed in it to receive the integrated circuit device 24. The second conductive element 22 of the first conductive pattern 16 is exposed on the interior flat surface of a cavity and the first conductive element 18 is buried under overlying dielectric layers. The second conductive pattern is disposed between the first and second dielectric layers 12 and 14. The second dielectric layer 14 may be formed from multiple individual layers of LTCC material with passive electrical elements, such as resistors, capacitors, inductors and transformers, formed between the layers and the thermally conductive via or vias formed through the layers.

A low temperature co-fired ceramic substrate structure has been described having a dual use buried layer functioning as a capacitor plate and a heat transfer layer. The buried layer is disposed between a first and a second dielectric layer. A conductive pattern is formed on the top surface of the first dielectric layer over the buried dual use layer. The top surface conductive pattern has a first conductive element functioning as the other plate of the capacitor and a second conductive element function as a voltage potential lead for an integrated circuit mounted on the second conductive element. One or more thermally conductive vias are formed in the second dielectric substrate beneath the second conductive element. The vias are thermally coupled to the dual use buried layer to provide thermal management for heat generated in the substrate. A third conductive pattern may be formed on the bottom surface of the second dielectric layer that is thermally coupled to the vias. A heat sink may be disposed adjacent to the bottom surface of the second dielectric layer that is thermally coupled to the vias. In the preferred embodiment of the invention, the vias are electrically conductive.

It will be obvious to those having skill in the art that many changes may be made to the details of the above-described embodiments of this invention without departing from the underlying principles thereof. The scope of the present invention should, therefore, be determined only by the following claims.

What is claimed is:

1. A low temperature co-fired ceramic substrate structure for receiving an integrated circuit device mounted thereon where the bottom surface of the integrated circuit device is a voltage input lead for the integrated circuit device comprising:

first and second dielectric layers having top and bottom surfaces;

a first conductive pattern formed on the top surface of the first dielectric layer having a first conductive element functioning as a first plate of a capacitor and a second conductive element functioning as a voltage potential lead for the integrated circuit;

a second conductive pattern disposed between the first and second dielectric layers and positioned below the first conductive pattern functioning as a second plate of the capacitor and as a thermally conductive heat transfer layer for the integrated circuit device; and at least a first thermally conductive via formed between the top and bottom surfaces of the second dielectric layer and below the second conductive element and thermally coupled to the second conductive pattern.

2. The substrate structure as recited in claim 1 wherein the thermally conductive via comprises cylindrically formed bores filled with gold.

3. The substrate structure as recited in claim 1 further comprising a heat sink disposed adjacent to the bottom surface of the second dielectric layer and thermally coupled to the thermally conductive via.

4. The substrate structure as recited in claim 1 further comprising a third conductive pattern formed on the bottom surface of the second dielectric layer that is thermally coupled to the thermally conductive via.

5. The substrate structure as recited in claim 4 further comprising a heat sink disposed adjacent to the bottom surface of the second dielectric layer and thermally coupled to the third conductive pattern.

6. The substrate structure recited in claim 5 wherein the thermally conductive via is electrically conductive.

7. The substrate structure as recited in claim 1 further comprising a plurality of thermally conductive via formed between the top and bottom surfaces of the second dielectric layer below the second conductive element and thermally coupled to the second conductive element.

8. The substrate structure as recited in claim 7 wherein the plurality of thermally conductive vias comprise cylindrically formed bores filled with gold.

9. The substrate structure as recited in claim 8 wherein the plurality of cylindrically formed thermally conductive vias have a diameter of approximately 0.010 inches.

10. The substrate structure as recited in claim 9 wherein the plurality of thermally conductive vias are formed in a matrix pattern.

11. The substrate structure as recited in claim 10 wherein the plurality of thermally conductive vias in the matrix pattern have a center to center separation of approximately 0.020 inches.

12. The substrate structure as recited in claim 11 further comprising a heat sink disposed adjacent to the bottom surface of the second dielectric layer and thermally coupled to the plurality of thermally conductive vias.

13. The substrate structure as recited in claim 12 wherein the plurality of thermally conductive vias are electrically conductive.

14. The substrate structure as recited in claim 11 further comprising a third conductive pattern formed on the bottom surface of the second dielectric layer that is thermally coupled to the plurality of thermally conductive vias.

15. The substrate structure as recited in claim 14 further comprising a heat sink disposed adjacent to the bottom surface of the second dielectric layer and thermally coupled to the third conductive pattern.

16. The substrate structure as recited in claim 15 wherein the plurality of thermally conductive vias are electrically conductive.

17. The substrate structure as recited in claim 1 wherein the first dielectric layer has a thickness of approximately 0.004 inches.

18. The substrate structure as recited in claim 1 wherein the second dielectric layer has a thickness of approximately 0.025 inches.

19. The substrate structure as recited in claim 1 wherein the first and second conductive patterns have a thickness of approximately 0.0005 inches.

* * * * *